(12) United States Patent
Hamada et al.

(10) Patent No.: US 9,640,610 B2
(45) Date of Patent: May 2, 2017

(54) SEMICONDUCTOR DEVICE AND METHOD OF MANUFACTURING SEMICONDUCTOR DEVICE

(71) Applicant: MITSUBISHI ELECTRIC CORPORATION, Chiyoda-ku (JP)

(72) Inventors: Kenji Hamada, Tokyo (JP); Naruhisa Miura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/109,597

(22) PCT Filed: Feb. 6, 2015

(86) PCT No.: PCT/JP2015/053405
§ 371 (c)(1),
(2) Date: Jul. 1, 2016

(87) PCT Pub. No.: WO2015/129430
PCT Pub. Date: Sep. 3, 2015

(65) Prior Publication Data
US 2016/0336390 A1 Nov. 17, 2016

(30) Foreign Application Priority Data
Feb. 28, 2014 (JP) .................................. 2014-037760

(51) Int. Cl.
*H01L 29/15* (2006.01)
*H01L 29/06* (2006.01)
(Continued)

(52) U.S. Cl.
CPC .......... *H01L 29/063* (2013.01); *H01L 21/046* (2013.01); *H01L 21/26506* (2013.01);
(Continued)

(58) Field of Classification Search
CPC ............... H01L 29/063; H01L 29/1095; H01L 29/1608; H01L 29/32; H01L 29/66068;
(Continued)

(56) References Cited

U.S. PATENT DOCUMENTS 7,400,017 B2   7/2008  Aono et al.
7,737,011 B2   6/2010  Tsuchida et al.
(Continued)

FOREIGN PATENT DOCUMENTS

JP   2008-053667 A   3/2008
JP   2008-192737 A   8/2008
(Continued)

OTHER PUBLICATIONS

International Search Report issued on Apr. 21, 2015 for PCT/JP2015/053405 filed on Feb. 6, 2015.

*Primary Examiner* — Tu-Tu Ho
(74) *Attorney, Agent, or Firm* — Oblon, McClelland, Maier & Neustadt, L.L.P.

(57) ABSTRACT

An IGBT includes an emitter electrode, base regions, an emitter region, a collector region, a collector electrode, a gate insulating film provided in contact with the silicon carbide semiconductor region, the emitter region, and the base region, and a gate electrode that faces the gate insulating film. A FWD includes a base contact region provided adjacent to the emitter region and electrically connected to the emitter electrode, and a cathode region disposed in the upper layer part on the other main surface side of the silicon carbide semiconductor region, provided adjacent to the collector region, and electrically connected to the collector electrode. The IGBT further includes a reduced carrier-trap region disposed in a principal current-carrying region of the silicon carbide semiconductor region located above the collector region and having a smaller number of carrier traps (Continued)

than the silicon carbide semiconductor region located above the cathode region.

21 Claims, 13 Drawing Sheets

(51) Int. Cl.
| | |
|---|---|
| H01L 29/66 | (2006.01) |
| H01L 29/739 | (2006.01) |
| H01L 29/16 | (2006.01) |
| H01L 21/265 | (2006.01) |
| H01L 29/32 | (2006.01) |
| H01L 21/04 | (2006.01) |
| H01L 27/06 | (2006.01) |
| H01L 29/10 | (2006.01) |
| H01L 29/08 | (2006.01) |

(52) U.S. Cl.
CPC ...... *H01L 27/0664* (2013.01); *H01L 29/1095* (2013.01); *H01L 29/1608* (2013.01); *H01L 29/32* (2013.01); *H01L 29/66068* (2013.01); *H01L 29/7395* (2013.01); *H01L 29/7397* (2013.01); *H01L 29/0834* (2013.01)

(58) Field of Classification Search
CPC ............. H01L 29/7395; H01L 29/7397; H01L 21/046; H01L 21/26506; H01L 27/0664
USPC ........................................................ 257/77
See application file for complete search history.

(56) References Cited

U.S. PATENT DOCUMENTS

| | | | |
|---|---|---|---|
| 7,754,589 B2 | 7/2010 | Tsuchida et al. | |
| 7,834,362 B2 | 11/2010 | Tsuchida et al. | |
| 8,659,052 B2 * | 2/2014 | Ikeda .................. | H01L 27/0727 |
| | | | 257/133 |
| 8,815,708 B2 | 8/2014 | Tsuchida et al. | |
| 9,337,185 B2 * | 5/2016 | Pfirsch et al. ...... | H01L 27/0635 |
| 2013/0146969 A1 | 6/2013 | Fujiwara et al. | |

FOREIGN PATENT DOCUMENTS

| | | |
|---|---|---|
| JP | 4791704 B2 | 10/2011 |
| JP | 2013-048247 A | 3/2013 |
| JP | 2013-125763 A | 6/2013 |
| JP | 2014-017325 A | 1/2014 |

* cited by examiner

F I G. 1
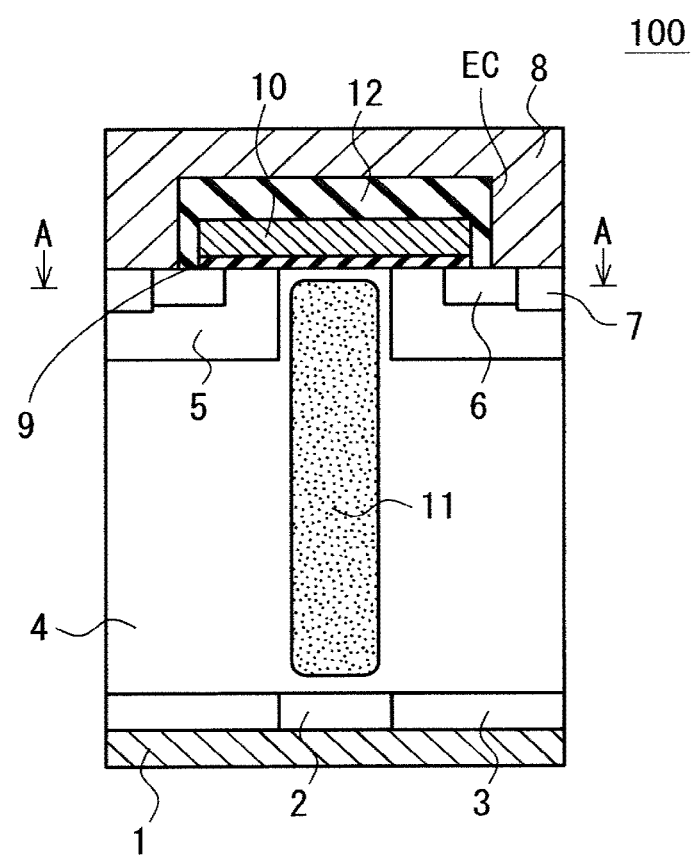

F I G. 2 2
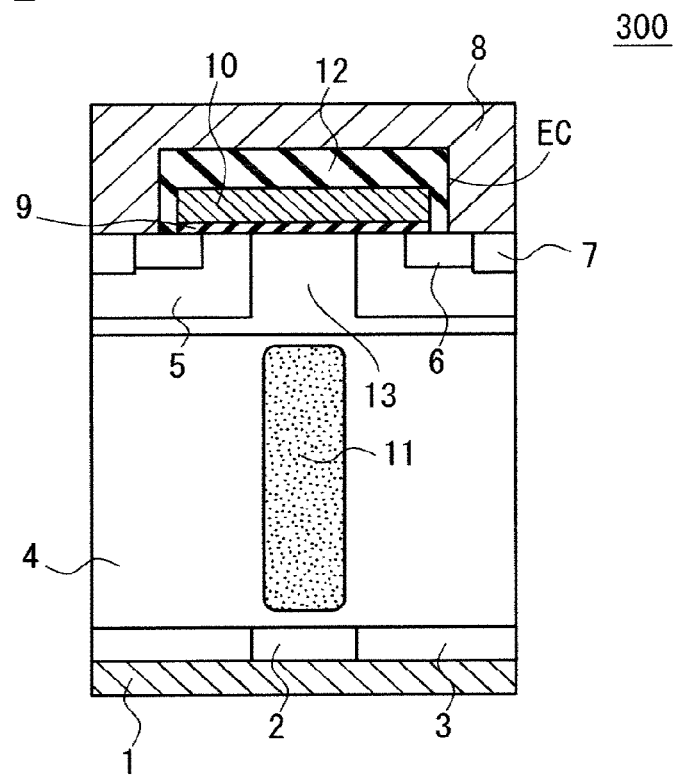
F I G. 2 3
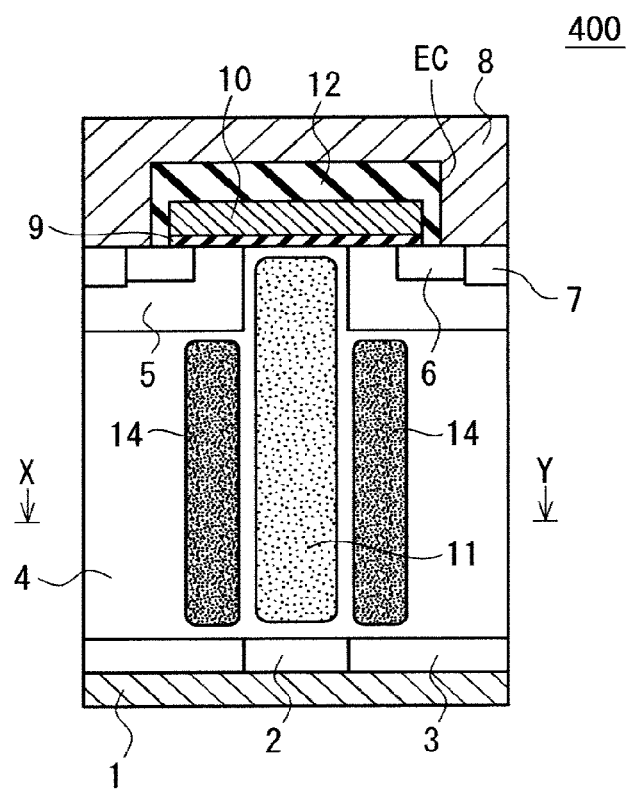

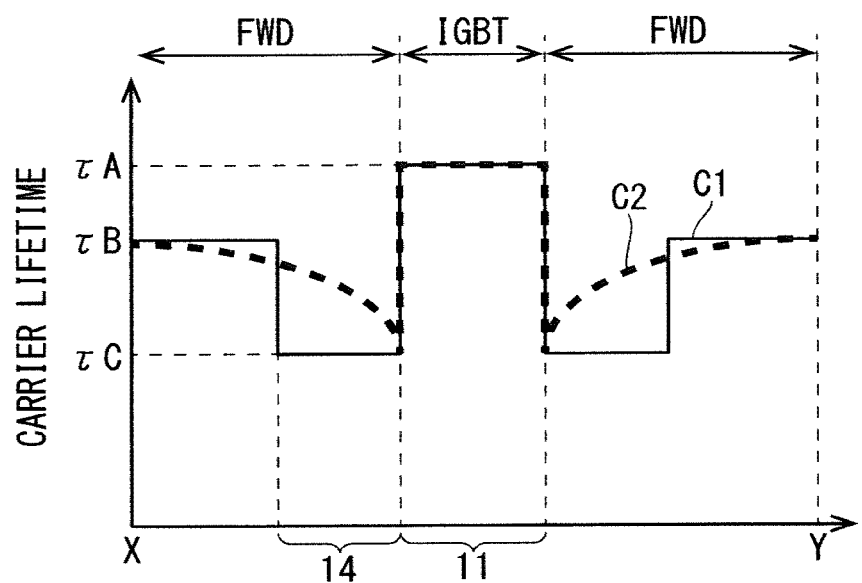
F I G. 2 4

US 9,640,610 B2

SEMICONDUCTOR DEVICE AND METHOD OF MANUFACTURING SEMICONDUCTOR DEVICE

TECHNICAL FIELD

The present invention relates to a semiconductor device and, in particular, relates to a technique for improving electrical characteristics of a semiconductor device.

BACKGROUND ART

There are conventionally known power semiconductor devices in which an insulated gate bipolar transistor (IGBT) that uses a silicon (Si) substrate as a semiconducting material, and a freewheeling diode (FWD) that is connected in inverse-parallel with the IGBT are formed in the same semiconductor substrate.

For example, Patent Document 1 discloses a semiconductor device in which an IGBT and an FWD are formed in the same semiconductor substrate, a common electrode that functions as both an emitter electrode of the IGBT and an anode electrode of the FWD is formed on the front side of the substrate, and a common electrode that functions as both a collector electrode of the IGBT and a cathode electrode of the FWD is formed on the rear side of the substrate. Such a semiconductor device is called a reverse conducting (RC-) IGBT.

In general, the Si substrate has a long carrier lifetime, and therefore in the RC-IGBT, the recovery characteristics of the FWD often become a problem. Specifically, when the operating (forward conducting) state of the IGBT is switched to the reverse recovery (recovery) state of the FWD, a forward current continues to flow until minority carriers accumulated in the semiconductor substrate recombine and disappear, thus resulting in an increase in switching loss.

As a method for improving the recovery characteristics of the FWD, a carrier lifetime control method is used, in which a short carrier lifetime layer is formed by irradiating the entire semiconductor substrate, i.e., the entire IGBT region and the entire FWD region, with radiation such as light ions or electron beams and introducing crystal defects in the semiconductor substrate as carrier lifetime killers.

With this method, the crystal defects in the semiconductor substrate become centers of recombination, accelerating the recombination of minority carriers at the time of recovery of the FWD and improving the recovery characteristics of the FWD.

Patent Document 2 proposes a method in which a region for forming a short carrier lifetime layer is limited to only the FWD region (i.e., carrier lifetime killers are not introduced in the IGBT region), and discloses a technique for improving the recovery characteristics of the FWD without impairing the current-carrying capability of the IGBT.

PRIOR ART DOCUMENTS

Patent Documents

Patent Document 1: Japanese Patent Publication No. 4791704
Patent Document 2: Japanese Patent Application Laid-Open No. 2008-192737

SUMMARY OF THE INVENTION

Problems to be Solved by the Invention

Silicon carbide (SiC) semiconductors have wider bandgaps than Si semiconductors, and SiC semiconductor devices using SiC semiconductors are capable of high-temperature operations because of their higher pressure resistance, higher allowable current density, and higher heat resistance than Si semiconductor devices using Si semiconductors. Accordingly, the SiC semiconductor devices are being developed as next-generation power semiconductor devices.

The Si substrates used in power semiconductor devices are generally made by a floating zone-melting method (FZ method). The Si substrates obtained by this method are of very high purity and have no defects, and therefore have long carrier lifetimes of one millisecond or more. On the other hand, it is very difficult to obtain SiC substrates of as high purity as that of the Si substrates, and typical SiC substrates have carrier lifetimes of only the order of one microsecond. This is considered because a large number of impurities or crystal defects such as intrinsic defects, dislocations, or lamination defects are present within the SiC substrates, serving as the centers of recombination and, by extension, as carrier lifetime killers.

Thus, the conventional methods of forming a short carrier lifetime layer in only the FWD region, which are conventional techniques for improving the characteristics of RC-IGBTs using Si substrates, cannot be applied to the RC-IGBTs using SiC substrates.

Specifically, there is a tradeoff relationship between the recovery characteristics and current-carrying characteristics of the RC-IGBTs using SiC substrates, such as the IGBTs having excellent recovery characteristics thanks to the presence of a large number of carrier lifetime killers, but instead having poor current-carrying characteristics of the IGBT. Then, the "partial introduction of carrier lifetime killers" as in the Si substrates has no effect on the SiC substrates because a large number of carrier lifetime killers are present in the crystal.

The present invention has been achieved in order to solve the problems as described above, and it is an object of the present invention to provide an SiC semiconductor device having improved electrical characteristics.

Means for Solving Problems

The semiconductor device according to the present invention is a semiconductor device that includes an insulated-gate type bipolar transistor formed in a silicon carbide semiconductor region of a second conductivity type and a diode connected in inverse-parallel with the insulated-gate type bipolar transistor. The insulated-gate type bipolar transistor includes an emitter electrode disposed on one main surface of the silicon carbide semiconductor region, a plurality of base regions of a first conductivity type selectively disposed in an upper layer part on a side of the one main surface of the silicon carbide semiconductor region, an emitter region of the second conductivity type selectively disposed in an upper layer part of each of the base regions and electrically connected to the emitter electrode, a collector region of the first conductivity type disposed in an upper layer part on a side of the other main surface of the silicon carbide semiconductor region, a collector electrode disposed on the other main surface of the silicon carbide semiconductor region and electrically connected to the collector region, a gate insulating film disposed in continuous contact with the silicon carbide semiconductor region, the emitter region, and the base regions, and a gate electrode arranged to face the silicon carbide semiconductor region, the emitter region, and the base regions via the gate insulating film. The diode includes a base contact region of the first conductivity type provided adjacent to the emitter region and electrically connected to the emitter electrode, and a cathode region of the second conductivity type disposed in the upper layer part on the side of the other main surface of the silicon carbide semiconductor region, provided adjacent to the collector region, and electrically connected to the collector electrode. The insulated-gate type bipolar transistor further includes a reduced carrier-trap region disposed in a principal current-carrying region of the silicon carbide semiconductor region located above the collector region, and having a smaller number of carrier traps than the silicon carbide semiconductor region located above the cathode region.

Advantageous Effect of the Invention

In the semiconductor device according to the present invention, the reduced carrier-trap region is formed in the current-carrying region of the transistor. This improves the carrier lifetime in the principal current-carrying region of the transistor, thus improving the current-carrying capability of the transistor.

BRIEF DESCRIPTION OF DRAWINGS

FIG. 1 is a cross-sectional view of a configuration of a semiconductor device according to Embodiment 1 of the present invention.

FIG. 22 is a cross-sectional view of a configuration of a semiconductor device according to Embodiment 3 of the present invention.

FIG. 23 is a cross-sectional view of a configuration of a semiconductor device according to Embodiment 4 of the present invention.

FIG. 24 illustrates distributions of the carrier lifetime.

EMBODIMENTS FOR IMPLEMENTING THE INVENTION

Embodiment 1

Apparatus Configuration

Figure 2:
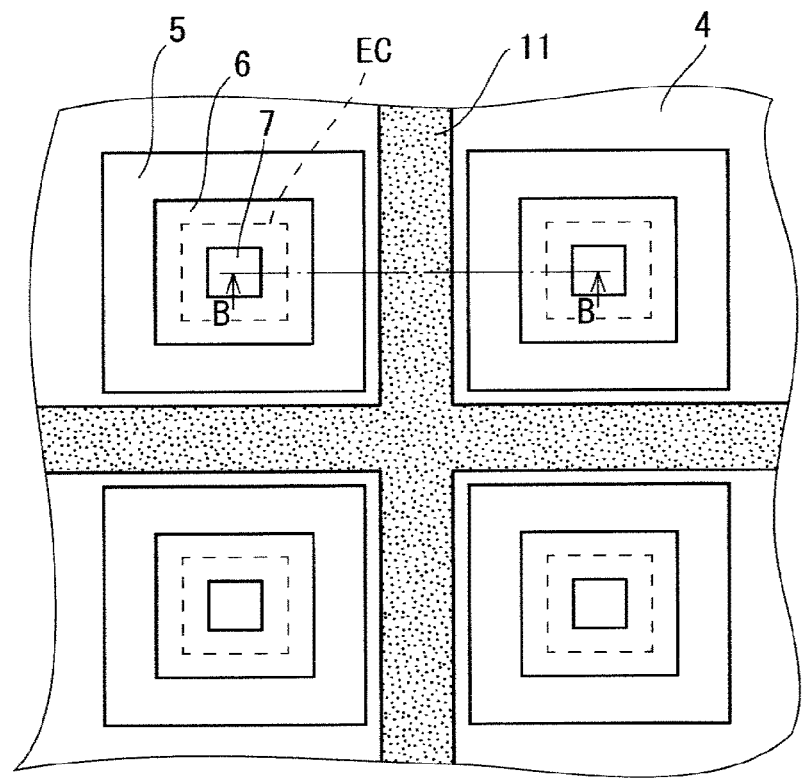
FIG. 2 is a plan view of the configuration of the semiconductor device according to Embodiment 1 of the present invention.

FIG. 1 is a cross-sectional view of a configuration of an SiC-RC-IGBT 100 according to Embodiment 1 of the present invention. In FIG. 1, part of a cross-section of the SiC-RC-IGBT 100 is illustrated, and in an actual semiconductor chip, a plurality of the same configurations are repeatedly arranged in the active region, but for the sake of convenience, the configuration of FIG. 1 is referred to as the "SiC-RC-IGBT 100."

In the following description, the conductivity types of impurities are generally defined such that the n type is a "first conductivity type" and the p type is a "second conductivity type," but these definitions may be reversed.

As illustrated in FIG. 1, a plurality of base regions 5 of the first conductivity type (n type) are selectively formed in the upper layer part on one main surface side of a drift region 4 (silicon carbide semiconductor region) of the second conductivity type (p type), and a base contact region 7 of the first conductivity type is selectively formed in the upper layer part of each base region 5. Then, an emitter region 6 of the second conductivity type is formed in contact with a side surface of the base contact region 7.

The emitter region 6 surrounds the base contact region 7, and the emitter region 6 and the base contact region 7 are formed such that they have approximately the same depth from the outermost surface of the drift region 4 located within the base region 5 or that the base contact region 7 is slightly deeper than the emitter region 6.

A gate insulating film 9 is selectively formed on the drift region 4, and a gate electrode 10 is formed on the gate insulating film 9. Specifically, the gate insulating film 9 is provided between two adjacent base regions 5, extending from part of the top of one emitter region 6 over the tops of one base region 5 and the drift region 4 to part of the top of the emitter region 6 of the other adjacent base region 5, and the gate electrode 10 is provided to cover the top of the gate insulating film 9.

Then, an interlayer insulation film 12 is formed to cover the gate insulating film 9 and the gate electrode 10, and an emitter electrode 8 is formed to cover the interlayer insulation film 12. The interlayer insulation film 12 has contact holes EC in regions other than the region that covers the gate electrode 10, the contact holes EC passing through the interlayer insulation film 12 in the direction of thickness and reaching part of the surfaces of the emitter regions 6 and the entire surfaces of the base contact regions 7. The contact holes EC are filled with the emitter electrode 8, and the emitter electrode 8 is electrically connected to the emitter regions 6 and the base contact regions 7.

On the other hand, a collector region 2 of the first conductivity type and cathode regions 3 of the second conductivity type provided in contact with both side surfaces of the collector region 2 are formed in the upper layer part on the other main surface side of the drift region 4. Then, a collector electrode 1 is formed to cover the tops of the collector region 2 and the cathode regions 3.

Then, a reduced carrier-trap region 11 is formed to extend in the direction of thickness of the drift region 4 from a region between the base regions 5, which serves as the principal current-carrying region of the IGBT, downward within the drift region 4. The region for forming the reduced carrier-trap region 11 spans approximately the entire thickness of the drift region 4.

Here, "carrier traps" refer to defects or impurities that disturb the regularity of arrangement of atoms or molecules in a semiconductor. In the presence of carrier traps, carriers are captured and the movement of the carriers is inhibited. The reduced carrier-trap region is a region having a reduced number of carrier traps. The mechanism for reducing carrier traps will be described later.

Next, the shape of the SiC-RC-IGBT 100 as viewed in a plan view will be described with reference to FIG. 2. FIG. 2 is a plan view taken along line A-A and viewed in the direction of arrows in FIG. 1, in which the gate electrode 10 of the drift region 4 and some other constituent elements are not shown. As illustrated in FIG. 2, the emitter regions 6 surround the base contact regions 7 having a generally square outer shape, and the base regions 5 surround the outer peripheries of the emitter regions 6. While the contact holes EC are provided in contact with the base contact regions 7 and part of the emitter regions 6 around the base contact regions 7, they are hidden from view and thus indicated by broken lines. A cross-section taken along line B-B in FIG. 2 corresponds to FIG. 1, and in the array of the plurality of base regions 5 provided in a matrix, the reduced carrier-trap region 11 provided along the drift region 4 between the base regions 5 has a mesh-like shape in a plan view.

While FIG. 2 shows an example in which the base regions 5 are arranged in an array of two rows and two columns in the right, left, top, and bottom sides, this is merely one example, and the base regions 5 may be arranged in a staggered configuration or a comb-like configuration. The shape of the base regions 5 as viewed in a plan view is not limited to a square shape, and may be a polygonal shape such as a hexagon.

While the above description is given using the example in which the region for forming the reduced carrier-trap region 11 spans approximately the entire thickness of the drift region 4, the present invention is not limited to this example. The region may be set as appropriate in consideration of the tradeoff relationship between the recovery characteristics and the current-carrying characteristics, as long as the region serves as the principal current-carrying region of the IGBT.

Manufacturing Method

Hereinafter, a method of manufacturing the SiC-RC-IGBT 100 will be described with reference to FIGS. 3 to 9, which are cross-sectional views illustrating manufacturing steps in order.

First, the drift region 4 is prepared. The drift region 4 is an epitaxial growth layer formed by epitaxial growth on an SiC substrate, which serves as a support substrate, and is obtained by removing the SiC substrate after the formation of the epitaxial growth layer. A substrate constituted by the epitaxial growth layer obtained in this manner is referred to as a "freestanding substrate (self-supported substrate)," and the step of preparing the drift region 4 means a step of preparing such a freestanding substrate. In the following description, the freestanding substrate constituted by the drift region 4 may be simply referred to as an "SiC substrate."

Figure 3:
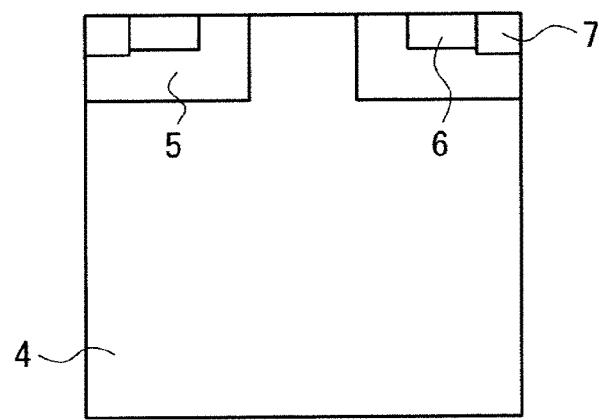
FIG. 3 is a cross-sectional view illustrating a step of manufacturing the semiconductor device according to Embodiment 1 of the present invention.

Next, in the step illustrated in FIG. 3, first conductivity type (n type) impurity ions are implanted through an implantation mask patterned in a predetermined shape in the upper layer part on one main surface side of the drift region 4 to selectively form the plurality of base regions 5.

Then, second conductivity type (p type) impurity ions are implanted through an implantation mask patterned in a predetermined shape in the upper layer part of each base region 5 to selectively form the emitter region 6.

Moreover, first conductivity type impurity ions are implanted through an implantation mask patterned in a predetermined shape in each emitter region 6 to selectively form the base contact region 7.

The implantation masks used may, for example, be photoresists for photolithography or silicon oxide films.

The order in which the base regions 5, the emitter region 6, and the base contact region 7 are formed is not limited to the above example.

The base regions 5 are set to have an impurity concentration of $1 \times 10^{17}$ $cm^{-3}$ to $1 \times 10^{19}$ $cm^{-3}$ and a depth of 0.5 to 3 μm, the emitter region 6 is set to have an impurity concentration of $1 \times 10^{18}$ $cm^{-3}$ to $1 \times 10^{20}$ $cm^{-3}$ and a depth of 0.2 to 1 μm, and the base contact region 7 is set to have an impurity concentration of $1 \times 10^{19}$ $cm^{-3}$ to $1 \times 10^{21}$ $cm^{-3}$ and a depth of 0.2 to 1 μm.

The ion implantation may be performed using flat implantation energy, or the implantation energy may be changed in stages, e.g., from high energy to low energy.

At the time of the above ion implantation, the temperature of the SiC substrate is set in the range of 10° C. to 1000° C. This brings about the effect of allowing crystal defects (implantation defects) generated at the time of ion implantation to recover to some extent.

Figure 4:
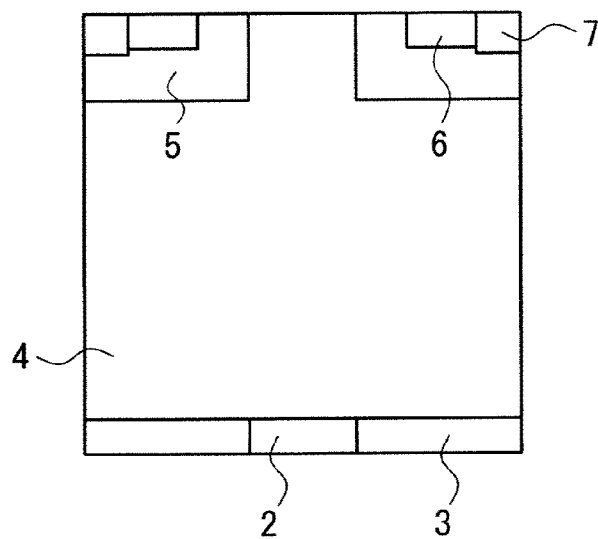
FIG. 4 is a cross-sectional view illustrating a step of manufacturing the semiconductor device according to Embodiment 1 of the present invention.

Then, in the step illustrated in FIG. 4, first conductivity type impurity ions are implanted through an implantation masks patterned in a predetermined shape in the upper layer part on the other main surface side of the drift region 4 to form the collector region 2.

Then, second conductivity type impurity ions are implanted through an implantation mask patterned in a predetermined shape in the upper layer part on the other main surface of the drift region 4 to selectively form the plurality of cathode regions 3 adjacent to the collector region 2. The order in which the collector region 2 and the cathode regions 3 are formed is not limited to the above example.

The collector region 2 is set to have an impurity concentration of $1 \times 10^{18}$ $cm^{-3}$ to $1 \times 10^{21}$ $cm^{-3}$ and a depth of 0.2 to 3 μm, and the cathode regions 3 are set to have an impurity concentration of $1\times10^{18}$ cm$^{-3}$ to $1\times10^{21}$ cm$^{-3}$ and a depth of 0.2 to 3 μm.

The first conductivity type impurities to be ion-implanted may be nitrogen or phosphorous, and the second conductivity type impurities may be aluminum or boron. The implantation surface density (dose amount) of implanted ions at the time of ion implantation may be set in the range of $1\times10^{13}$ cm$^{-2}$ to $1\times10^{16}$ cm$^{-2}$, and the implantation energy may be set in the range of 10 keV to 10 MeV.

The collector region 2 is provided to correspond to the drift region 4 located in the region between the base regions 5, and when the base regions 5 are arranged in a grid, the collector region 2 also has a mesh-like shape in a plan view, like the drift region 4 located in the region between the base regions 5. The cathode regions 3 are provided to correspond to the base regions 5 and, similar to the base regions 5, have a square shape in a plan view.

Figure 5:
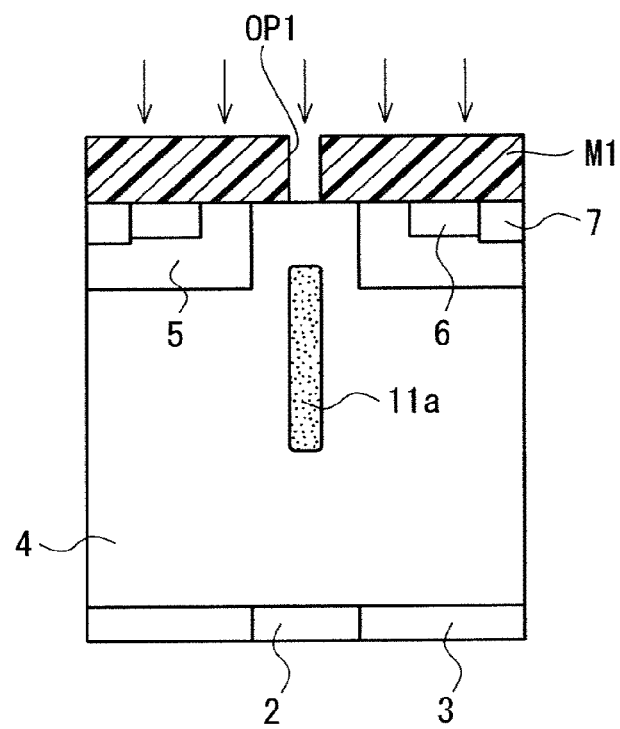
FIG. 5 is a cross-sectional view illustrating a step of manufacturing the semiconductor device according to Embodiment 1 of the present invention.

Then, in the step illustrated in FIG. 5, an implantation mask M1 having an opening OP1 in a predetermined region between the base regions 5 is formed on the one main surface of the drift region 4 in which the base regions 5 and so on are provided. Then, interstitial carbon-inducing ions are implanted (interstitial-carbon-inducing ion implantation) through the implantation mask M1 to form a surplus carbon atom-containing region 11a where there are surplus interstitial carbon atoms.

The interstitial carbon-inducing ion implantation may be performed using flat implantation energy, or the implantation energy may be changed in stages, e.g., from high energy to low energy.

The interstitial carbon-inducing ion implantation may also be performed from the other main surface side of the drift region 4 on which the collector region 2 and so on are provided, or may be performed alternately from both main surface sides of the drift region 4 in order to form the surplus carbon atom-containing region 11a with lower implantation energy.

Examples of the interstitial carbon-inducing ions to be implanted include carbon, silicon, hydrogen, and helium, and the implantation surface density (dose amount) of implanted ions at the time of interstitial carbon-inducing ion implantation is set in the rage of $1\times10^{13}$ cm$^{-2}$ to $1\times10^{16}$ cm$^{-2}$, and the implantation energy is set in the range of 10 keV to 10 MeV.

At the time of interstitial carbon-inducing ion implantation, the temperature of the SiC substrate is set in the range of 10° C. to 1000° C.

The important point here is that the surplus carbon atom-containing region 11a is formed in only the principal current-carrying region of the IGBT (from the region between the base regions 5 downward within the drift region 4).

The implantation energy at the time of interstitial carbon-inducing ion implantation is greater than the implantation energy used at the time of dopant ion implantation. Thus, it is possible to form the surplus carbon atom-containing region 11a that reaches a deeper region than the base regions 5, the emitter region 6, and the base contact region 7 can reach.

The implantation surface density at the time of interstitial carbon-inducing ion implantation may preferably be set to, for example, $1\times10^{14}$ cm$^{-2}$ or more in order to exceed the density of carrier traps existing in the drift region 4 and, in particular, in the principal current-carrying region of the IGBT. This reliably reduces carrier traps in the current-carrying region.

While the above description takes the example of the case in which the interstitial carbon-inducing ions are implanted after the implantation of dopant ions for forming the base regions 5 and so on, the order in which the interstitial carbon-inducing ion implantation and the dopant ion implantation are performed may be reversed.

Figure 6:
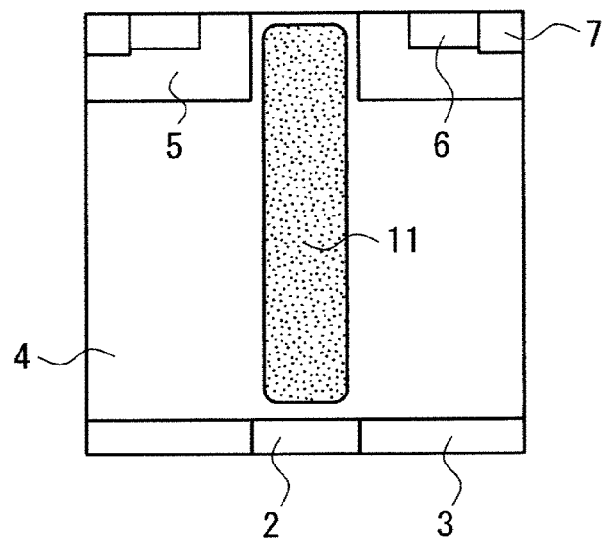
FIG. 6 is a cross-sectional view illustrating a step of manufacturing the semiconductor device of Embodiment 1 according to the present invention.

Then, after the implantation mask M1 is removed, the SiC substrate is heated in the step illustrated in FIG. 6. This causes the dopant atoms to be activated as well as causes the interstitial carbon atoms to be thermally diffused in the inside of the drift region 4 and bonded to point defects existing in the principal current-carrying region of the IGBT (from the region between the base regions 5 downward within the drift region 4), thus forming the reduced carrier-trap region 11 in only the principal current-carrying region of the IGBT. Here, the principal current-carrying region refers to a region that includes a central position between two adjacent base regions as viewed in a cross section and that ranges from the one main surface of the drift region 4 to the interface between the drift region 4 and the collector region 2.

The heating temperature of the SiC substrate in this step is set in the range of 1000° C. to 2000° C. and, more preferably, in the range of 1400° C. to 1800° C. This reliably reduces carrier traps.

The reduced carrier-trap region 11 obtained through the above-described steps has a carrier trap density of $1\times10^{9}$ cm$^{-3}$ to $1\times10^{13}$ cm$^{-3}$. Since the drift region 4 other than the reduced carrier-trap region 11 has a carrier trap density of $1\times10^{11}$ cm$^{-3}$ to $1\times10^{15}$ cm$^{-3}$, it can be seen that the reduced carrier-trap region 11 has a reduced number of carrier traps. The carrier trap density may be measured by a method such as deep-level transient spectroscopy (DLTS), for example.

The carrier lifetime in the reduced carrier-trap region is in the range of 1 microseconds to 1 milliseconds. Since the carrier lifetime in the drift region 4 other than the reduced carrier-trap region 11 is in the range of 1 nanoseconds to 1 microseconds, it can be seen that the carrier lifetime in the reduced carrier-trap region 11 is longer. The carrier lifetime may be measured by a method such as microwave photoconductivity decay (μ-PCD), for example.

Here, the interstitial carbon-inducing ion implantation will be described in more detail. Usually, atomic ions implanted in a crystal would not enter lattice points of lattices forming the crystal, and are present between lattices (interstitially). The "interstitial carbon" refers to carbon atoms existing between lattices, and ion implantation of carbon atoms causes the carbon atoms to be present between lattices as a matter of course.

Ion implantation of ions (e.g., silicon, hydrogen, or helium) that do not serve as dopants in an SiC crystal causes carbon atoms (lighter than silicon) existing on lattice points in the SiC crystal to be ejected and moved to the spaces between lattices.

Since the carbon vacancies (lattice points on which the ejected carbon atoms originally existed) are replaced by ions implanted at the time of heat treatment for activation, new carrier lifetime killers are not created.

Since, as described previously, the Si substrate is of very high purity with no defects and has a long carrier lifetime of 1 milliseconds or more, it is known that the RC-IGBTs using Si substrates is brought into a state in which carrier traps have been generated by implanting ions such as hydrogen, which do not serve as dopants, in a non-defect substrate and thereby causing implantation defects in the substrate. However, the present invention is to induce interstitial carbon by implanting ions that do not serve as dopants in an SiC semiconductor where there are a large number of carrier lifetime killers and to thereby partially create a region having a reduced number of carrier traps. In other words, the present invention is to partially form a region in which the carrier lifetime is improved.

Specifically, the present invention improves the tradeoff relationship between the recovery characteristics and current-carrying characteristics of the SiC-RC-IGBTs by using a technical idea that is diametrically opposite to the idea used in the case of the RC-IGBTs using Si substrates.

Let us now return to the description of the manufacturing steps. While the above description takes the example of the manufacturing method in which the reduced carrier-trap region 11 is formed by implanting interstitial carbon-inducing ions and heating the SiC substrate, a method may be employed, in which the reduced carrier-trap region 11 is formed by thermally oxidizing the SiC substrate and causing the surplus interstitial carbon atoms generated in the process of thermal oxidation to be diffused in the inside of the drift region 4.

In this case, a mask of oxide film having an opening in a predetermine region (i.e., region between the base regions 5) of the one main surface of the drift region 4 is formed by a method such as chemical vapor deposition (CVD) other than thermal oxidation, and then the SiC substrate is thermally oxidized to form a thermal oxide film in the opening of the mask. This allows the thermal oxide film to be selectively formed on the drift region 4 located in the region between the base regions 5 and thereby allows the reduced carrier-trap region 11 to be formed in the principal current-carrying region of the IGBT.

Then, the SiC substrate is thermally oxidized in an oxygen atmosphere to form the gate insulating film 9 on the entire one main surface of the drift region 4 in which the base regions 5 and so on are provided. The thickness of the gate insulating film 9 is set in the range of for example, 10 to 100 nm. The gate insulating film 9 may be an oxide film formed by a method such as CVD, instead of the thermal oxide film.

After that, the gate electrode 10 is formed on the gate insulating film 9 by a method such as CVD. The material for the gate electrode 10 may, for example, be polysilicon, and the thickness of the gate electrode 10 is set in the range of, for example, 100 nm to 1 µm.

Figure 7:
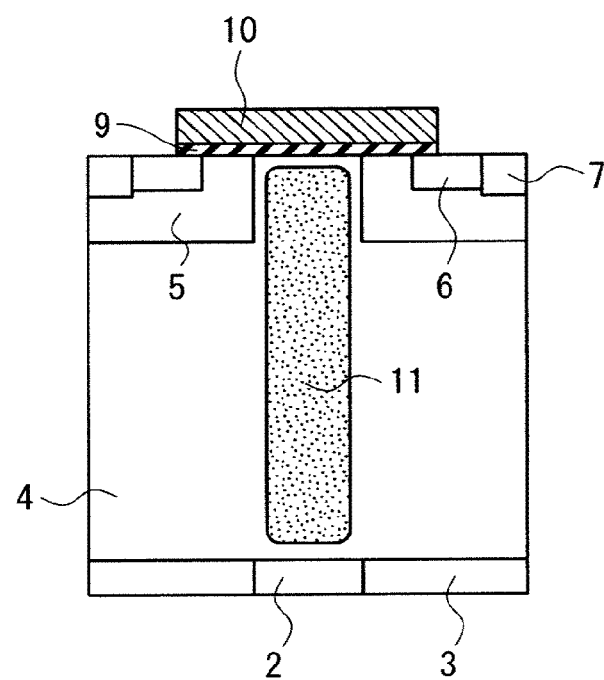
FIG. 7 is a cross-sectional view illustrating a step of manufacturing the semiconductor device according to Embodiment 1 of the present invention.

After that, an etching mask patterned in a predetermined shape is formed on the gate electrode 10, and the gate electrode 10 and the gate insulating film 9 are etched using the etching mask in order to form the gate insulating film 9 and the gate electrode 10 to cover part of the top of the emitter region 6 and the tops of the base regions 5 and the drift region 4 as illustrated in FIG. 7.

Figure 8:
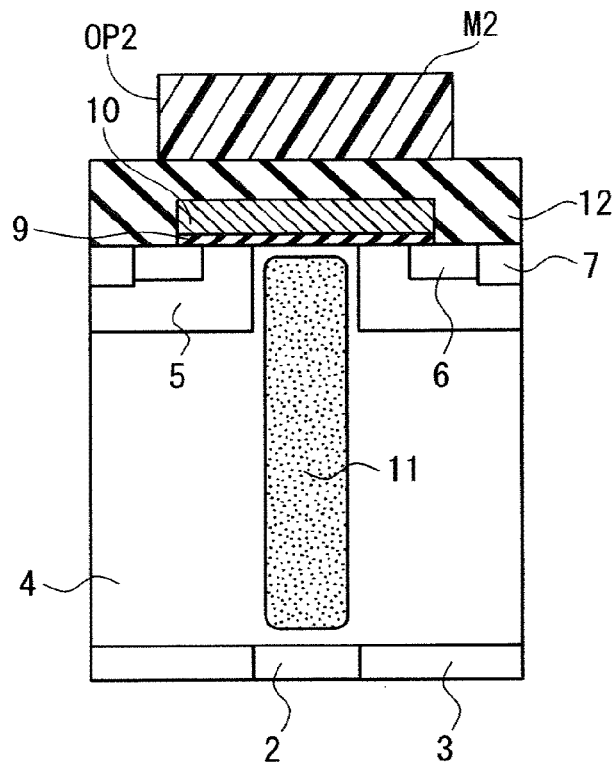
FIG. 8 is a cross-sectional view illustrating a step of manufacturing the semiconductor device according to Embodiment 1 of the present invention.

Next, in the step illustrated in FIG. 8, the interlayer insulation film 12 is formed by a method such as CVD on the entire one main surface of the drift region 4 in which the base regions 5 and so on are provided, and an etching mask M2 having an opening OP2 in a predetermined region is formed on the interlayer insulation film 12. The opening OP2 of the etching mask M2 is provided in a hole-like shape to expose, at its bottom, the top of a region that corresponds to the base contact region 7 and part of the emitter region 6 around the base contact region 7.

Then, the interlayer insulation film 12 is etched using the etching mask M2 to remove the interlayer insulation film 12 that corresponds to the opening OP2 of the etching mask M2 and to form a contact hole EC that passes through the interlayer insulation film 12 in the direction of thickness and reaches the surface of part of the emitter region 6 and the entire surface of the base contact region 7.

Figure 9:
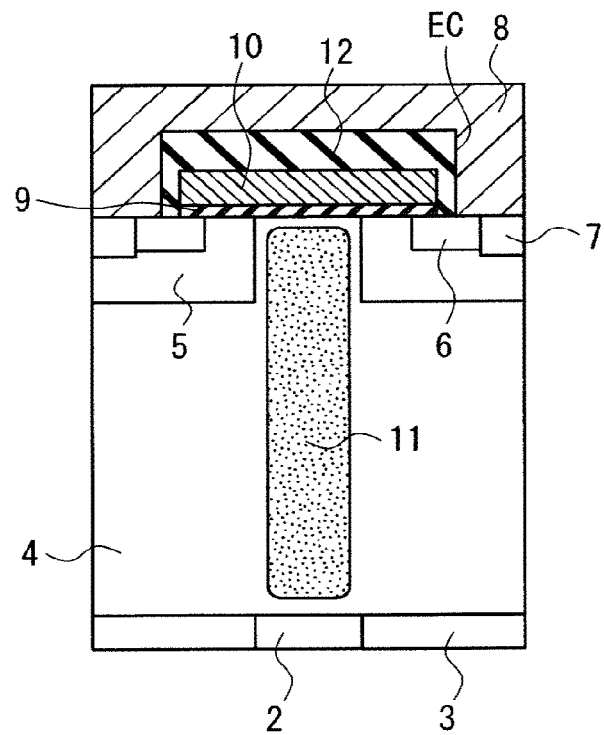
FIG. 9 is a cross-sectional view illustrating a step of manufacturing the semiconductor device according to Embodiment 1 of the present invention.

Then, after the etching mask M2 is removed, the emitter electrode 8 is formed to cover the top of the interlayer insulation film 12 and to fill the contact hole EC in the step illustrated in FIG. 9. The emitter electrode 8 may be made of, for example, aluminum, titanium, nickel, gold, silver, copper, or an alloy of a combination of these materials by a method such as electron beam evaporation or sputtering. Note that the emitter electrode 8 is configured to be in ohmic contact with the emitter region 6 and the base contact region 7.

Finally, the collector electrode 1 is formed on the entire surfaces of the collector region 2 and the cathode regions 3. This produces the SiC-RC-IGBT 100 in which the emitter electrode 8 and the collector electrode 1 face each other as illustrated in FIG. 1. The collector electrode 1 may be made of, for example, aluminum, titanium, nickel, gold, silver, or copper, or an alloy of a combination of these materials by a method such as electron beam evaporation or sputtering, and configured to be in ohmic contact with the collector region 2 and the cathode regions 3.

While the above description takes the example of the case in which the base regions 5, the emitter region 6, the base contact region 7, the collector region 2, and the cathode regions 3 are formed by ion implantation, some or all of these regions may be formed by epitaxial growth and by using an etching technique.

As described above, the reduced carrier-trap region 11 of the SiC-RC-IGBT 100 according to Embodiment 1 is formed in only the principal current-carrying region of the IGBT (from the region between the base regions 5 downward within the drift region 4), and the recombination of minority carriers will thus not be reduced at the time of recovery of the FWD. Thus, the current-carrying capability of the IGBT can be improved without impairing the recovery characteristics of the FWD.

That is, in the operating (forward conducting) state of the IGBT, the reduced carrier-trap region 11 serves as a carrier conduction region and achieves low resistance, and when the operating state is switched to the recovery state of the FWD, carriers are diffused in the drift region and this accelerates recombination. The recovery characteristics will thus not be impaired.

Embodiment 2

Apparatus Configuration

Figure 10:
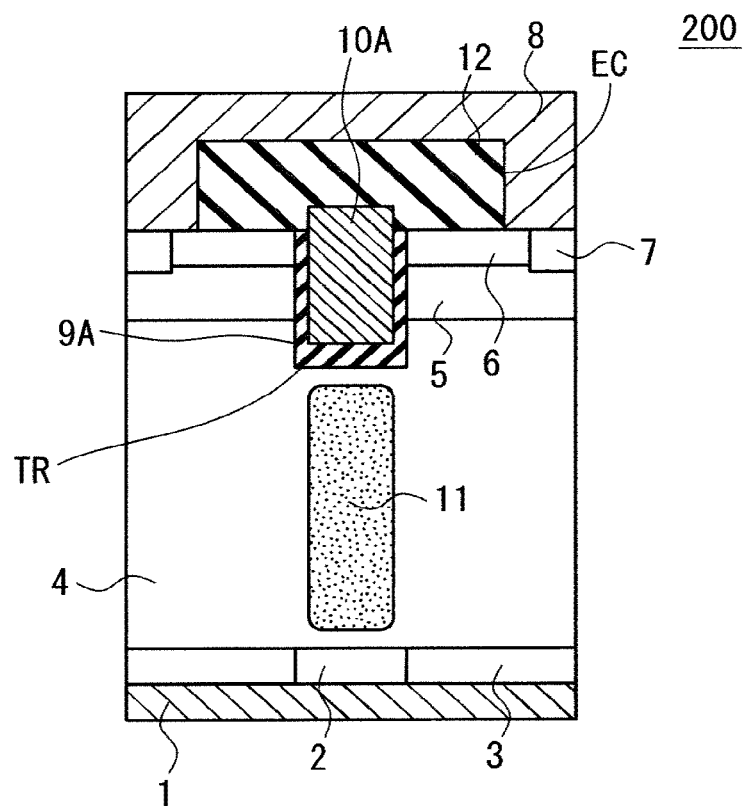
FIG. 10 is a cross-sectional view of a configuration of a semiconductor device according to Embodiment 2 of the present invention.
Figure 11:
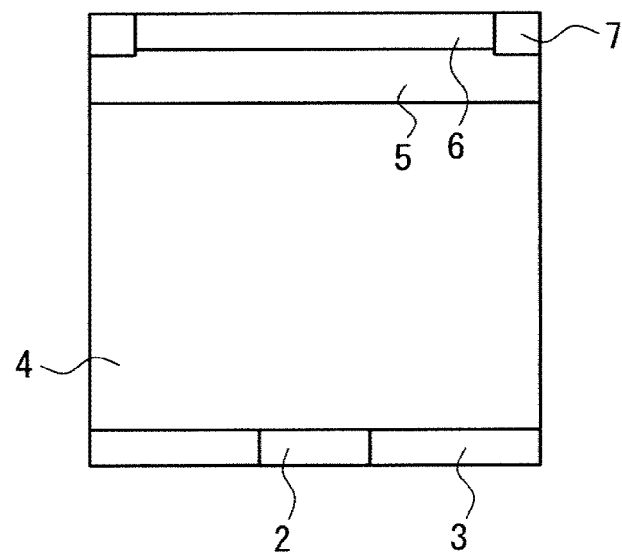
FIG. 11 is a cross-sectional view illustrating a step of manufacturing the semiconductor device according to Embodiment 2 of the present invention.

FIG. 10 is a cross-sectional view of a configuration of an SiC-RC-IGBT 200 according to Embodiment 2 of the present invention. In FIG. 10, part of a cross-section of the SiC-RC-IGBT 200 is illustrated, and in an actual semiconductor chip, a plurality of the same configurations are repeatedly arranged in the active region, but for the sake of convenience, the configuration of FIG. 10 is referred to as the "SiC-RC-IGBT 200."

As illustrated in FIG. 10, the plurality of base regions 5 of the first conductivity type (n type) are selectively formed in the upper layer part on one main surface side of the drift region 4 of the second conductivity type (p type), and the base contact region 7 of the first conductivity type is selectively formed in the upper layer part of each base region 5. Then, the emitter region 6 of the second conductivity type is formed in contact with a side surface of the base contact region 7.

The emitter region 6 surrounds the base contact region 7, and the emitter region 6 and the base contact region 7 are formed such that they have approximately the same depth from the outermost surface of the drift region 4 located within the base region 5 or the base contact region 7 is slightly deeper than the emitter region 6.

The emitter region 6 is provided to extend to the edge of the base region 5 in the horizontal direction (direction parallel to the main surface of the SiC substrate). The drift region 4 located in the region between two adjacent base regions 5 has a trench TR having a width that corresponds to the entire horizontal width of the drift region 4, and the inner surface of the trench TR is covered with a gate insulating film 9A. Then, the trench TR is formed in contact with the side surfaces of the emitter region 6 and the base regions 5 to reach the inside of the drift region 4, and the side surfaces of the emitter region 6 and the base region 5 are in contact with the surface of the gate insulating film 9A.

The shape of the base regions 5 in a plan view is defined by the trench TR and is square as illustrated in FIG. 2. The base regions 5 are arranged in a matrix. Like the reduced carrier-trap region 11 illustrated in FIG. 2, the trench TR has a mesh-like shape in a plan view.

Then, a gate electrode 10A is formed to fill the trench TR whose inner surface is covered with the gate insulating film 9A. The gate electrode 10A is formed such that part of the gate electrode 10A protrudes from the trench TR. The interlayer insulation film 12 is formed to cover the gate electrode 10A, the gate insulating film 9A, and the emitter region 6, and the emitter electrode 8 is formed to cover the interlayer insulation film 12. The interlayer insulation film 12 has the contact hole EC that passes through the interlayer insulation film 12 in the direction of thickness and reaches the surface of part of the emitter region 6 and the entire surface of the base contact region 7. The contact hole EC is filled with the emitter electrode 8, and the emitter electrode 8 is electrically connected to the emitter region 6 and the base contact region 7.

Note that the configuration in which part of the gate electrode 10A protrudes from the trench TR is not an absolute necessity. That is, the upper surface of the gate electrode 10A may be at the same level as the upper surface of the emitter region 6, or may be at a lower level than the upper surface of the emitter region 6.

The SiC-RC-IGBT 100 of Embodiment 1 described with reference to FIG. 1 is of a planar type in which channels are horizontally formed in the vicinity of the main surface of the SiC substrate, whereas the SiC-RC-IGBT 200 of Embodiment 2 is of a trench type in which a channel is formed along the trench that is formed perpendicular to the main surfaces of the SiC substrate.

The collector region 2 of the first conductivity type and the cathode regions 3 of the second conductivity type provided in contact with both side surfaces of the collector region 2 are formed in the upper layer part on the other main surface side of the drift region 4. Then, the collector electrode 1 is formed to cover the tops of the collector region 2 and the cathode regions 3.

In the drift region 4 below the gate electrode 10A, which serves as the current-carrying region of the IGBT, the reduced carrier-trap region 11 is formed to extend in the thickness direction of the drift region 4 from the vicinity of the bottom surface of the gate electrode 10A to the vicinity of the collector region 2.

The region for forming the reduced carrier-trap region 11 is not limited to the above example, and may be set as appropriate in consideration of the tradeoff relationship between the recovery characteristics and the current-carrying characteristics, as long as the region serves as the current-carrying region of the IGBT.

Manufacturing Method

Hereinafter, a method of manufacturing the SiC-RC-IGBT 200 will be described with reference to FIGS. 11 to 21, which are cross-sectional views illustrating manufacturing steps in order.

First, the drift region 4 is prepared. Next, in the step illustrated in FIG. 11, first conductivity type impurity ions are implanted in the upper layer part on one main surface side of the drift region 4 to form the base region 5 across the entire main surface.

Then, second conductivity type impurity ions are implanted in the upper layer part of the base region 5 to form the emitter region 6 across the entire main surface.

Moreover, first conductivity type impurity ions are implanted in the emitter region 6 through an implantation mask pattered in a predetermined shape to selectively form the base contact region 7.

The implantation mask used may, for example, be a photoresist for photolithography or a silicon oxide film.

The order in which the base region 5, the emitter region 6, and the base contact region 7 are formed is not limited to the above example.

The impurity concentrations and depths of the base region 5, the emitter region 6, and the base contact region 7 are the same as those of the base regions 5, the emitter regions 6, and the base contact regions 7 described in Embodiment 1, and therefore descriptions thereof are omitted.

Figure 12:
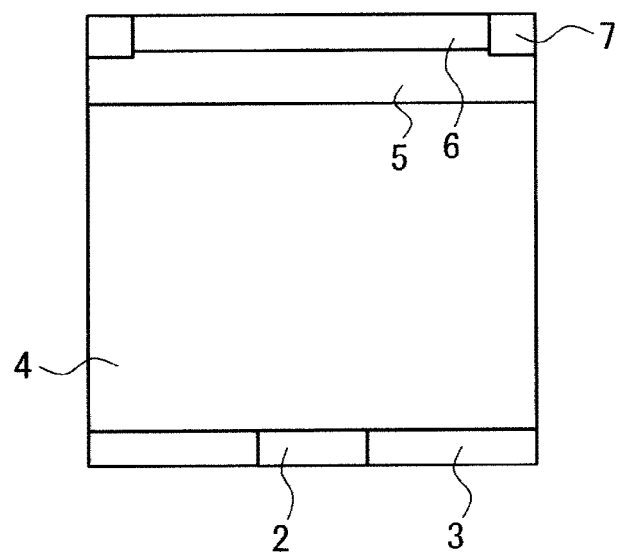
FIG. 12 is a cross-sectional view illustrating a step of manufacturing the semiconductor device according to Embodiment 2 of the present invention.

Then, in the step illustrated in FIG. 12, first conductivity type impurity ions are implanted through an implantation mask patterned in a predetermined shape in the upper layer part on the other main surface side of the drift region 4 to form the collector region 2.

Then, second conductivity type impurity ions are implanted through an implantation mask patterned in a predetermined shape in the upper layer part on the other main surface side of the drift region 4 to selectively form the plurality of cathode regions 3 adjacent to the collector region 2. Note that the order in which the collector region 2 and the cathode regions 3 are formed is not limited to the above example.

The impurity concentrations and depths of the collector region 2 and the cathode regions 3 are the same as those of the collector region 2 and the cathode regions 3 described in Embodiment 1, and therefore descriptions thereof are omitted.

The types of ions to be implanted and the implantation surface densities (dose amount) of implanted ions at the time of ion implantation are also the same as those in Embodiment 1, and therefore descriptions thereof are omitted.

Figure 13:
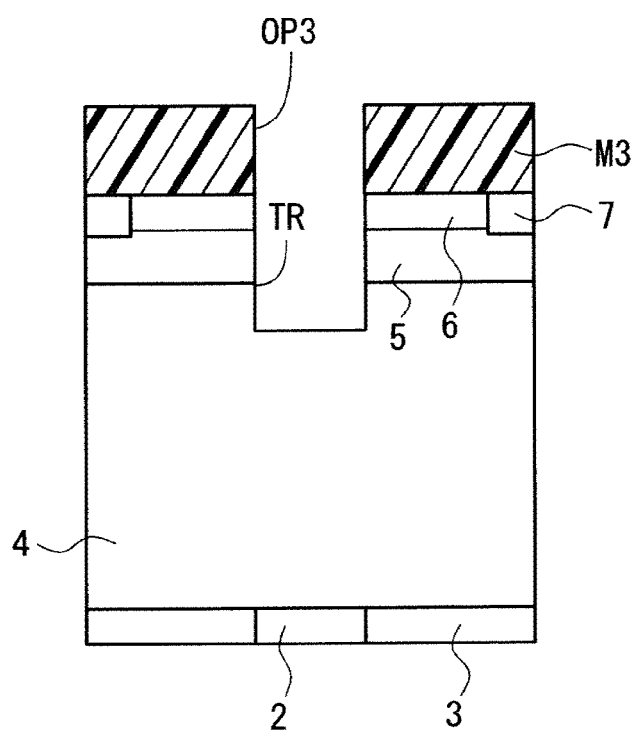
FIG. 13 is a cross-sectional view illustrating a step of manufacturing the semiconductor device according to Embodiment 2 of the present invention.

Next, in the step illustrated in FIG. 13, an etching mask M3 having an opening OP3 in a predetermined region is formed on the one main surface of the drift region 4 in which the base region 5 and so on are formed. The opening OP3 of the etching mask M3 is provided to expose, at its bottom, the emitter region 6 that corresponds to a region that is later to be the trench TR, and the shape of the opening OP3 in a plan view corresponds to the shape of the trench TR in a plan view.

Then, the emitter region 6, the base region 5, and the drift region 4 are etched using the etching mask M3 to form in the trench TR that passes through the emitter region 6 and the base region 5 and reaches the inside of the drift region 4.

Figure 14:
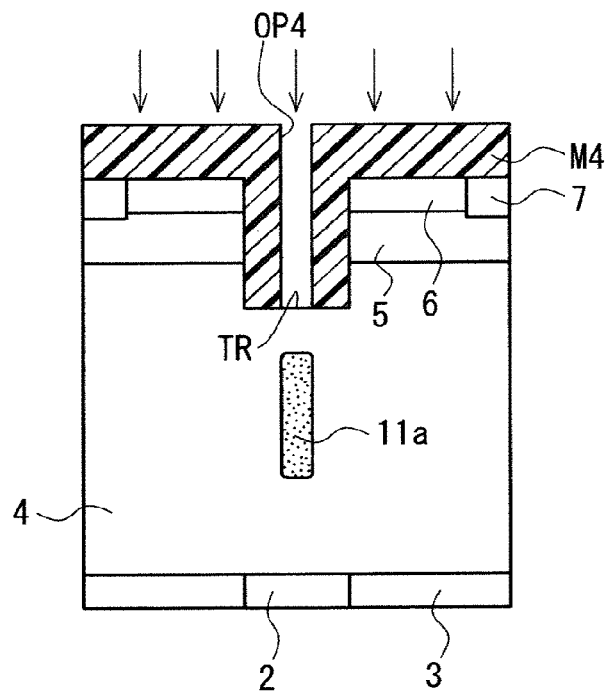
FIG. 14 is a cross-sectional view illustrating a step of manufacturing the semiconductor device according to Embodiment 2 of the present invention.

Then, after the etching mask M3 is removed, in the step illustrated in FIG. 14, an implantation mask M4 having an opening OP4 in a predetermined region of the trench TR is formed on the one main surface of the drift region 4 in which the base region 5 and so on are provided. Then, interstitial carbon-inducing ion implantation is performed using the implantation mask M4 to form a surplus carbon atom-containing region 11a where there are surplus interstitial carbon atoms.

The interstitial carbon-inducing ion implantation may be performed using flat implantation energy, or the implantation energy may be changed in stages, e.g., from high energy to low energy.

The interstitial carbon-inducing ion implantation may also be performed from the other main surface side of the drift region 4 on which the collector region 2 and so on are provided, or may be performed alternately from both main surface sides of the drift region 4 in order to form the surplus carbon atom-containing region 11a with lower implantation energy.

The interstitial carbon-inducing ions to be implanted and the implantation surface density (dose amount) and implantation energy of implanted ions are the same as those in the case of forming the surplus carbon atom-containing region 11a described in Embodiment 1, and therefore descriptions thereof are omitted.

Figure 15:
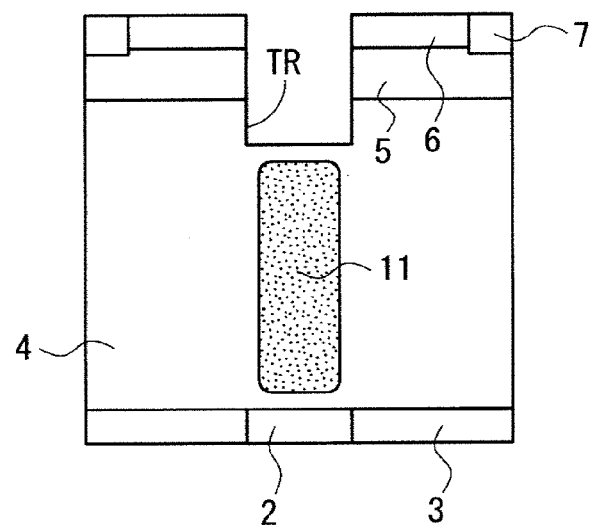
FIG. 15 is a cross-sectional view illustrating a step of manufacturing the semiconductor device according to Embodiment 2 of the present invention.

Then, after the implantation mask M4 is removed, the SiC substrate is heated in the step illustrated in FIG. 15. This causes the dopant atoms to be activated as well as causes the interstitial carbon atoms to be diffused in the inside of the drift region 4 and bonded to point defects existing in the principal current-carrying region of the IGBT (in the drift region 4 below the gate electrode 10a), thus forming the reduced carrier-trap region 11 in only the principal current-carrying region of the IGBT. Here, the principal current-carrying region refers to a region that includes a central position between two adjacent base regions as viewed in a cross section and that ranges from below the trench TR to the interface between the drift region 4 and the collector region 2.

The heating temperature of the SiC substrate in this step is set in the range of 1000° C. to 2000° C. and, more preferably, in the range of 1400° C. to 1800° C.

Figure 16:
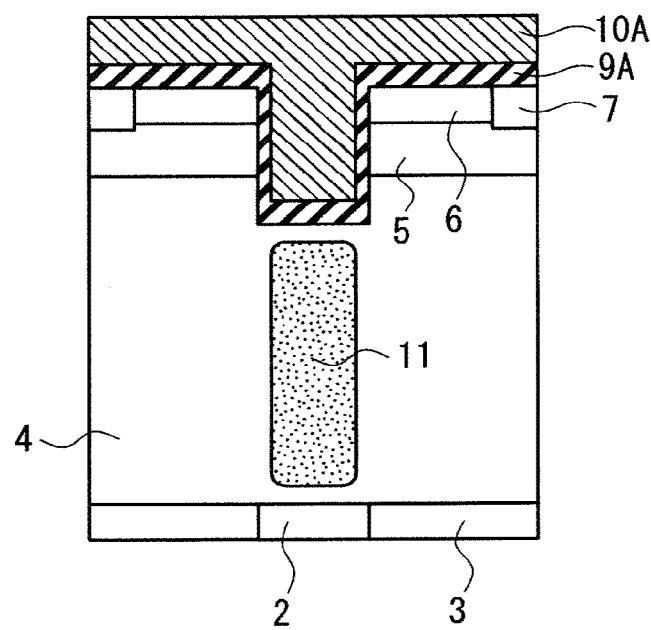
FIG. 16 is a cross-sectional view illustrating a step of manufacturing the semiconductor device according to Embodiment 2 of the present invention.

Then, the SiC substrate is thermally oxidized in an oxygen atmosphere, and in the step illustrated in FIG. 16, the gate insulating film 9A is formed on the entire one main surface of the drift region 4 in which the base region 5 and so on are provided. The thickness of the gate insulating film 9A is set in the range of, for example, 10 to 100 nm. Thus, the inner surface of the trench TR is also covered with the gate insulating film 9A. Note that the gate insulating film 9A may be an oxide film formed by a method such as CVD, instead of the thermal oxide film.

After that, the gate electrode 10A is formed on the gate insulating film 9A by a method such as CVD. The material for the gate electrode 10A may, for example, be polysilicon. The thickness of the gate electrode 10A is set to a thickness that allows the trench TR to be buried in the gate electrode 10A, and the gate electrode 10A is also formed on the emitter region 6 and the base contact region 7 with the gate insulating film 9A in between.

Figure 17:
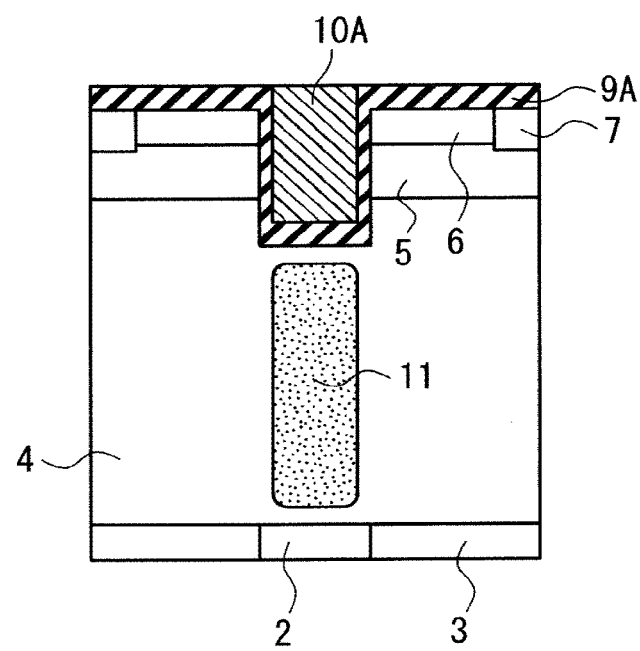
FIG. 17 is a cross-sectional view illustrating a step of manufacturing the semiconductor device according to Embodiment 2 of the present invention.

After that, in the step illustrated in FIG. 17, the gate electrodes 10A formed on the emitter region 6 and the base contact region 7 are removed by etching or other methods to leave the gate electrode 10A in only the trench TR.

Figure 18:
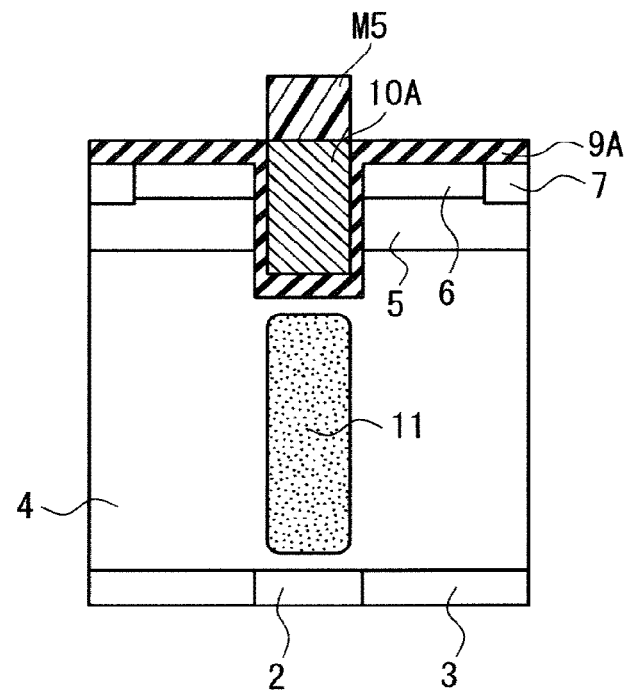
FIG. 18 is a cross-sectional view illustrating a step of manufacturing the semiconductor device according to Embodiment 2 of the present invention.

Then, an etching mask M5 patterned to cover only the top of the gate electrode 10A remaining in the trench TR is formed in the step illustrated in FIG. 18, and the gate insulating film 9A other than the gate insulating film 9A formed on the inner surface of the trench TR is removed by etching using the etching mask M5.

Figure 19:
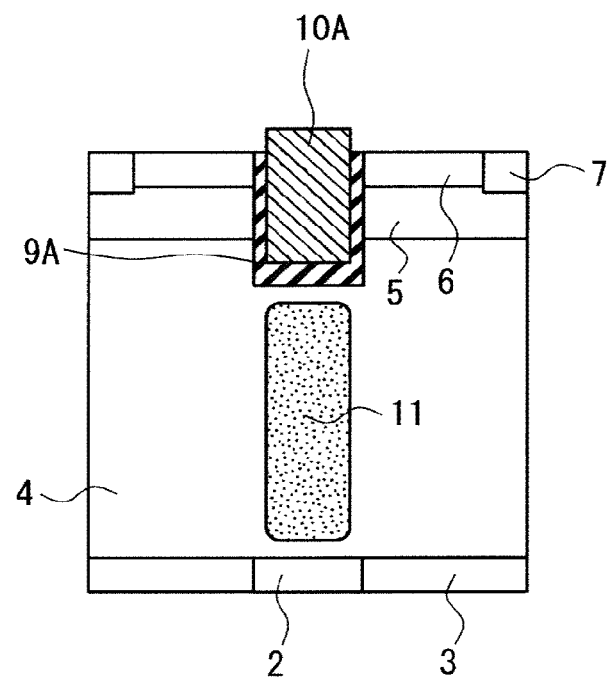
FIG. 19 is a cross-sectional view illustrating a step of manufacturing the semiconductor device according to Embodiment 2 of the present invention.

Through this step, part of the gate electrode 10A protrudes from the trench TR as illustrated in FIG. 19.

Note that the above step of causing part of the gate electrode 10A to protrude from the trench TR is not an absolute necessity. That is, the upper surface of the gate electrode 10A may be at the same level as the upper surface of the emitter region 6, or may be at a lower level than the upper surface of the emitter region 6. Alternatively, the interlayer insulation film 12 may be formed directly after the processing for causing the gate electrode 10A to remain in only the trench TR in the step illustrated in FIG. 17.

Figure 20:
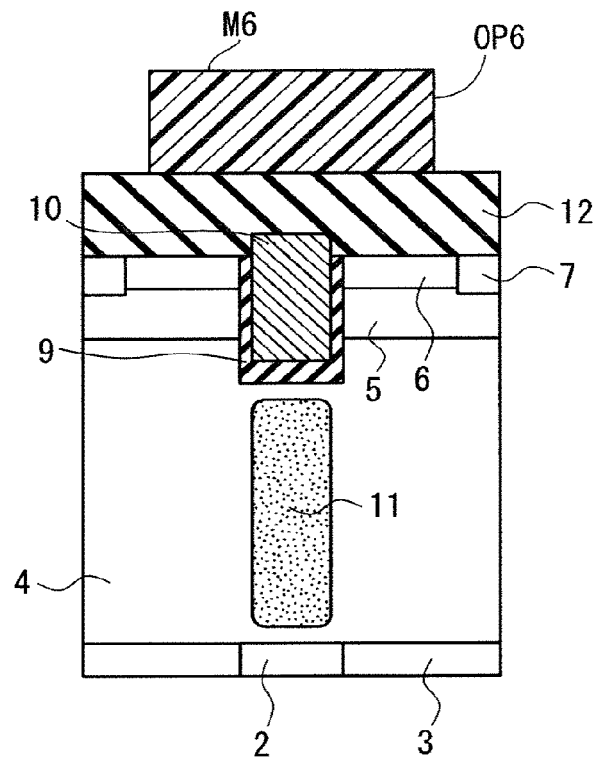
FIG. 20 is a cross-sectional view illustrating a step of manufacturing the semiconductor device according to Embodiment 2 of the present invention.

Next, in the step illustrated in FIG. 20, the interlayer insulation film 12 is formed by a method such as CVD on the entire one main surface of the drift region 4 in which the base region 5 and so on are provided, and an etching mask M6 having an opening OP6 in a predetermined region is formed on the interlayer insulation film 12. The opening OP6 of the etching mask M6 is provided in a hole-like shape to expose, at its bottom, the top of a region that corresponds to the base contact region 7 and part of the emitter region 6 around the base contact region 7.

Then, the interlayer insulation film 12 is etched using the etching mask M6 to remove the interlayer insulation film 12 that corresponds to the opening OP6 of the etching mask M6 and to form a contact hole EC that passes through the interlayer insulation film 12 in the direction of thickness and reaches the surface of part of the emitter region 6 and the entire surface of the base contact region 7.

Figure 21:
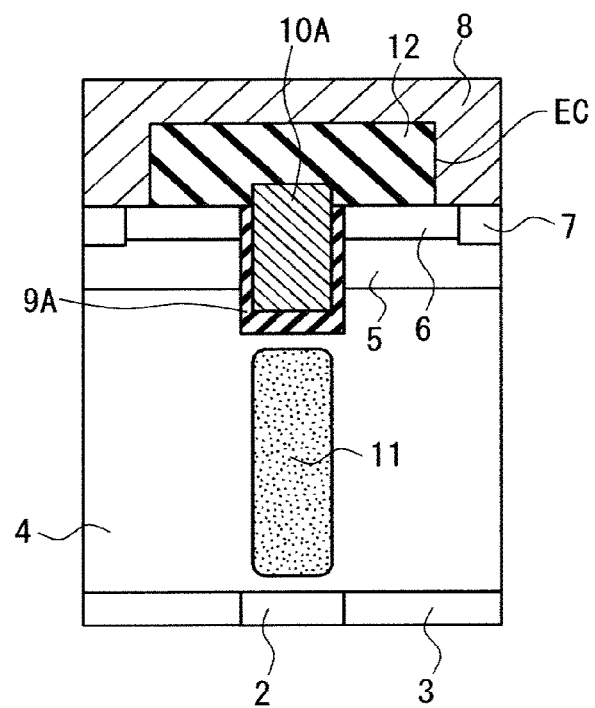
FIG. 21 is a cross-sectional view illustrating a step of manufacturing the semiconductor device according to Embodiment 2 of the present invention.

Then, after the etching mask M6 is removed, in the step illustrated in FIG. 21, the emitter electrode 8 is formed to cover the top of the interlayer insulation film 12 and fill the contact hole EC. The emitter electrode 8 may be made of, for example, aluminum, titanium, nickel, gold, silver, copper, or an alloy of a combination of these materials by a method such as electron beam evaporation or sputtering. Note that the emitter electrode 8 is configured to be in ohmic contact with the emitter region 6 and the base contact region 7.

Finally, the collector electrode 1 is formed on the entire surfaces of the collector region 2 and the cathode regions 3. This produces the SiC-RC-IGBT 200 in which the emitter electrode 8 and the collector electrode 1 face each other as illustrated in FIG. 10. The collector electrode 1 may be made of, for example, aluminum, titanium, nickel, gold, silver, copper, or an alloy of a combination of these materials by a method such as electron beam evaporation or sputtering, and configured to be in ohmic contact with the collector region 2 and the cathode regions 3.

While the above description takes the example of the case in which the base regions 5, the emitter region 6, the base contact region 7, the collector region 2, and the cathode regions 3 are formed by ion implantation, some or all of these regions may be formed by epitaxial growth and by using an etching technique.

As described above, in the SiC-RC-IGBT 200 of Embodiment 2, the reduced carrier-trap region 11 is formed in only the principal current-carrying region of the IGBT (in the drift region 4 below the gate electrode 10A), and the recombination of minority carriers will thus be not reduced at the time of recovery of the FWD. Thus, the current-carrying capability of the IGBT can be improved without impairing the recovery characteristics of the FWD.

That is, in the operating (forward conducting) state of the IGBT, the reduced carrier-trap region 11 serves as a carrier conduction region and achieves low resistance, and when the operating state is switched to the recovery state of the FWD, carriers are diffused in the drift region and this accelerates recombination. The recovery characteristics will thus not be impaired.

Embodiment 3

Apparatus Configuration

FIG. 22 is a cross-sectional view of a configuration of an SiC-RC-IGBT 300 according to Embodiment 3 of the present invention. In FIG. 22 part of a cross-section of the SiC-RC-IGBT 300 is illustrated, and in an actual semiconductor chip, a plurality of the same configurations are repeatedly arranged in the active region, but for the sake of convenience, the configuration illustrated in FIG. 22 is referred to as the "SiC-RC-IGBT 300."

In the SiC-RC-IGBT 300 illustrated in FIG. 22, an impurity region 13 that contains a relatively high concentration of second conductivity type impurities is provided across the entire main surface in the upper layer part on one main surface side of the drift region 4 of the second conductivity type (p type).

Then, a plurality of base regions 5 of the first conductivity type (n type) are selectively formed in the upper layer part of the impurity region 13, and a base contact region 7 of the first conductivity type is selectively formed in the upper layer part of each base region 5. Then, an emitter region 6 of the second conductivity type is formed in contact with a side surface of the base contact region 7.

The base regions 5, the emitter region 6, and the base contact region 7 are the same as those of the SiC-RC-IGBT 100 of Embodiment 1, and the gate insulating film 9, the gate electrode 10, the interlayer insulation film 12, and the emitter electrode 8 are also the same as those of the SiC-RC-IGBT 100 of Embodiment 1.

A collector region 2 of the first conductivity type and cathode regions 3 of the second conductivity type provided in contact with both side surfaces of the collector region 2 are formed in the upper layer part on the other main surface side of the drift region 4. Then, a collector electrode 1 is formed to cover the tops of the collector region 2 and the cathode regions 3. The collector region 2, the cathode regions 3, and the collector electrode 1 are the same as those of the SiC-RC-IGBT 100 of Embodiment 1.

In the SiC-RC-IGBT 300, the principal current-carrying region is located within the drift region 4 located below the impurity region 13 between the base regions 5, and a reduced carrier-trap region 11 is formed in only this current-carrying region. Thus, the reduced carrier-trap region 11 is not formed in the impurity region 13 between the base regions 5.

The region for forming the reduced carrier-trap region 11 is not limited to the above example, and may be set as appropriate in consideration of the tradeoff relationship between the recovery characteristics and the current-carrying characteristics, as long as that region serves as the principal current-carrying region of the IGBT.

Manufacturing Method

Hereinafter, a method of manufacturing the SiC-RC-IGBT 300 will be described. As described above, the SiC-RC-IGBT 300 illustrated in FIG. 22 differs from the SiC-RC-IGBT 100 illustrated in FIG. 1 in the additional presence of the impurity region 13.

Thus, the manufacturing method also differs from that of Embodiment 1 in the additional step of forming the impurity region 13. More specifically, a step of implanting second conductivity type impurity ions in the one main surface of the drift region 4 and forming the impurity region 13 across the entire main surface is added after the formation of the base regions 5, the emitter region 6, and the base contact region 7 as described with reference to FIG. 3 in Embodiment 1.

The implantation surface density (dose amount) at the time of ion implantation is set in the range of $1\times10^{11}$ cm$^{-2}$ to $1\times10^{14}$ cm$^{-2}$, the implantation energy is set in the range of 10 keV to 10 MeV, the impurity concentration is set in the range of $1\times10^{15}$ cm$^{-3}$ to $1\times10^{18}$ cm$^{-3}$, and the depth is set in the range of 0.5 to 5 μm.

Note that the above ion implantation is performed on condition that the temperature of the SiC substrate is set in the range of 10° C. to 1000° C.

While the above description takes the example of the case in which the impurity region 13 is formed after the formation of the base regions 5 and so on, the base regions 5 and so on may be formed after the formation of the impurity region 13.

Also, while the above description takes the example of the case in which the impurity region 13 is formed by ion implantation, the impurity region 13 may be formed by epitaxial growth and by using an etching technique.

After that, the collector region 2 and the cathode regions 3 are formed in the upper layer part on the other main surface side of the drift region 4 as described with reference to FIG. 4, an implantation mask having an opening in a predetermined region between the base regions 5 is formed on the one main surface of the drift region 4 in which the base regions 5 and so on are provided as described with reference to FIG. 5, and then a surplus carbon atom-containing region is formed by interstitial carbon-inducing ion implantation. In this case, the surplus carbon atom-containing region in Embodiment 3 is located below the impurity region 13 and formed to such a depth as not to reach the impurity region 13 even if interstitial carbon atoms are diffused in the inside of the drift region 4 in subsequent heat treatment.

The type of interstitial carbon-inducing ions and the implantation surface density (dose amount) and implantation energy of implanted ions are the same as those in Embodiment 1.

After that, the SiC substrate is heated. This causes the dopant atoms to be activated as well as causes the interstitial carbon atoms to be diffused in the inside of the drift region 4 and bonded to point defects existing in the principal current-carrying region of the IGBT (in the drift region 4 below the impurity region 13 between the base regions 5), thus forming the reduced carrier-trap region 11 in only the principal current-carrying region of the IGBT.

The heating temperature of the SiC substrate in this step is set in the range of 1000° C. to 2000° C. and, more preferably, in the range of 1400° C. to 1800° C.

Thereafter, as described with reference to FIGS. 7 to 9, the gate insulating film 9, the gate electrode 10, the interlayer insulation film 12, and the emitter electrode 8 are formed on the one main surface of the drift region 4, and the collector electrode 1 is formed on the other main surface of the drift region 4. This produces the SiC-RC-IGBT 300 in which the emitter electrode 8 and the collector electrode 1 face each other.

As described above, in the SiC-RC-IGBT 300 according to Embodiment 3, the reduced carrier-trap region 11 is formed in only the principal current-carrying region of the IGBT (in the drift region 4 below the impurity region 13 between the base regions 5), and the recombination of minority carriers will thus be not reduced at the time of recovery of the FWD. Thus, the current-carrying capability of the IGBT can be improved without impairing the recovery characteristics of the FWD.

That is, in the operating (forward conducting) state of the IGBT, the reduced carrier-trap region 11 serves as a carrier conduction region and achieves low resistance, and when the operating state is switched to the recovery state of the FWD, carriers are diffused in the drift region and this accelerates recombination. The recovery characteristics will thus not be impaired.

In addition, the provision of the impurity region 13 accelerates the accumulation of carriers at the time of applying current to the IGBT. Thus, it is anticipated that the current-carrying capability will be further improved as compared with the case of the SiC-RC-IGBT 100 of Embodiment 1.

Embodiment 4

Apparatus Configuration

FIG. 23 is a cross-sectional view of a configuration of an SiC-RC-IGBT 400 according to Embodiment 4 of the present invention. In FIG. 23, part of a cross-section of the SiC-RC-IGBT 400 is illustrated, and in an actual semiconductor chip, a plurality of the same configurations are repeatedly arranged in the active regions, but for the sake of convenience, the configuration of FIG. 23 is referred to as the "SiC-RC-IGBT 400."

In the SiC-RC-IGBT 400 illustrated in FIG. 23, a carrier trap region 14 in which the carrier lifetime is extremely short is formed in the drift region 4 located between the cathode regions 3 and the base regions 5 above the cathode regions 3. Note that the carrier trap region 14 is formed to sandwich the reduced carrier-trap region 11 formed above the collector region 2.

The carrier trap region 14 contains a larger number of carrier traps than the drift region 4 in which the carrier trap region 14 is not provided, among the drift region 4 located between the cathode regions 3 and the base regions 5 above the cathode regions 3, and therefore the carrier lifetime in the carrier trap region 14 is extremely short.

FIG. 24 illustrates a distribution of the carrier lifetime along a cross section taken along line X-Y in FIG. 23. In FIG. 24, the horizontal axis indicates the position on line X-Y, and the vertical axis indicates the carrier lifetime. The vertical axis has a logarithmic scale.

In FIG. 24, the region in which the reduced carrier-trap region 11 is formed serves as the IGBT region and is thus denoted as "IGBT," and the other region serving as the FWD is denoted as "FWD." In FIG. 24, C1 indicates the distribution when the carrier lifetime in each of the carrier trap region 14 and the drift region 4 is constant, and C2 indicates the distribution when the carrier lifetime in each of the regions changes with a gradient.

In FIG. 24, $\tau A > \tau B > \tau C$ is desirably satisfied, where TA is the carrier lifetime in the reduced carrier-trap region 11, $\tau B$ is the carrier lifetime in the drift region 4 above the cathode regions 3, and $\tau C$ is the carrier lifetime in the carrier trap region 14. When $\tau A > \tau B$ is satisfied, the current-carrying capability of the IGBT can be improved without impairing the recovery characteristics of the FWD. Moreover, it is possible, by setting $\tau C$ to be the smallest, it is possible to minimize an increase in element resistance due to bipolar degradation (described later in detail).

More specifically, $\tau C < 100$ ns is desirably satisfied in order to prevent the bipolar current from flowing through the carrier trap region 14; $\tau A > 1$ μs is desirably satisfied in order to sufficiently accelerate conductivity modulation in the current-carrying region of the IGBT; and TB is desirably set to an intermediate value (several hundred nanoseconds) between $\tau A$ and $\tau C$ in order to prevent impairment of the recovery characteristics of the FWD.

Hereinafter, the bipolar degradation will be described. In general, when minority carriers are injected (i.e., bipolar current flows) in a p-n diode, recombination energy is produced when the minority carriers recombine with major carriers. When the recombination of minority carriers occurs in a semiconductor such as an SiC crystal that contains a large number of crystal defects, the recombination energy causes, for example, basal surface defects in the SiC crystal as starting points to be extended into stacking faults, which are plane defects. The stacking faults (extended stacking faults) act as resistance and inhibit the flow of current, thus resulting in an increase in element resistance. This problem is called the "bipolar degradation."

In Embodiment 4 of the present invention, $\tau B > \tau C$ is satisfied, and therefore the bipolar current preferentially flows in the drift region 4 located above the cathode regions at the time of reflux operation of the FWD. Here, if some FWDs of the SiC-RC-IGBT 400 contain basal surface defects in the drift region 4 located above the cathode regions, the bipolar degradation of the FWDs occurs starting from the basal surface defects, and the resistance of the FWDs increases along with the extension of stacking faults.

When these extended stacking faults reach the adjacent carrier trap region 14, the FWDs will have an extremely high resistance as compared with the other FWDs (FWDs that do not contain basal surface defects in the drift region 4 located above the cathode regions) because the carrier lifetime in the carrier trap region 14 is extremely short. For this reason, the bipolar current does not flow in the FWDs, and the extension of stacking faults stops. Thus, the resistance of the principal current-carrying region of the IGBT does not increase even if extended stacking faults occur in the FWDs.

On the contrary, when the carrier trap region 14 is not formed, the extension of stacking faults in the FWDs does not stop, and the bipolar degradation proceeds endlessly until the extension is completed (reaches one main surface of the drift region 4 or the lower parts of the base regions 5).

While the above description takes the example of the case where the distribution of the carrier lifetime in each region is constant in the direction horizontal to the substrate as indicated by the distribution C1 in FIG. 24, the distribution of the carrier lifetime is not limited to the above example, and may be set as appropriate in consideration of the tradeoff relationship between the recovery characteristics and the current-carrying characteristics and the extension of stacking faults, such as giving a gradient in a direction horizontal to the substrate as indicated by the distribution C2 in FIG. 24.

Manufacturing Method

Hereinafter, a method of manufacturing the SiC-RC-IGBT 400 will be described. As described above, the SiC-RC-IGBT 400 illustrated in FIG. 23 differs from the SiC-RC-IGBT 100 illustrated in FIG. 1 in the additional presence of the carrier trap region 14.

The carrier trap region 14 is formed by irradiating the drift region 4 with electron beams from the one main surface side, or from the other main surface side, or from both of the main surface sides.

The timing of forming the carrier trap region 14 may be any time as long as it is after the step of forming the reduced carrier-trap region 11 described with reference to FIG. 6. Preferably, the carrier trap region 14 may be formed after the reduced carrier-trap region 11 is formed and before the gate insulating film 9 illustrated in FIG. 7 is formed.

The conditions of formation are that the region other than above the region for forming the carrier trap region 14 is covered with an irradiation mask, the dose of electron beams is set in the range of $1 \times 10^{14}$ cm$^{-2}$ to $1 \times 10^{17}$ cm$^{-2}$, and the irradiation energy is set in the range of 10 keV to 1 MeV.

The depth of the carrier trap region 14 in the direction of thickness of the substrate is adjustable by appropriately selecting the irradiation energy of electron beams, and the carrier lifetime in the carrier trap region 14 is adjustable by appropriately selecting the dose of electron beams.

As described above, in the SiC-RC-IGBT 400 according to Embodiment 4, the carrier trap region 14 in which the carrier lifetime is extremely short is formed in the drift region 4 located in the region between the cathode regions 3 and the base regions 5 above the cathode regions 3, and the carrier trap region 14 is formed to sandwich the reduced carrier-trap region 11 formed above the collector region 2. Thus, it is possible to minimize an increase in element resistance due to bipolar degradation and to improve the tradeoff relationship between the recovery characteristics and the current-carrying characteristics.

Variations

While Embodiments 1 to 4 given above describe the methods of manufacturing RC-IGBTs using the SiC substrate constituted by the drift region 4, RC-IGBTs may be manufactured using a substrate in which the drift region 4 is formed on a supporting substrate.

The supporting substrate may preferably be an SiC substrate (bulk substrate) that contains n- or p-type impurities and may preferably have an impurity concentration in the range of $1 \times 10^{11}$ cm$^{-3}$ to $1 \times 10^{21}$ cm$^{-3}$.

In the process of manufacturing the RC-IGBT, the supporting substrate may be removed or the thickness of the supporting substrate may be reduced by proper timing.

While Embodiments 1 to 4 take the examples of the case in which the present invention is applied to SiC-RC-IGBTs as semiconductor devices, the electrical characteristics of various other devices such as reverse conducting bipolar devices (e.g., thyristors or gate turn-off thyristors (GTOs)) can also be improved by applying the present invention.

Note that the crystal and conductivity types of SiC, a specific thickness of each impurity region, and a preferable numerical range of the impurity concentration in each impurity region are well known by those skilled in the art, and those numerical values given in Embodiments 1 to 3 of the present invention may be changed as appropriate.

While the invention has been shown and described in detail, the foregoing description is in all aspects illustrative and not restrictive. It is therefore to be understood that numerous modifications and variations can be devised without departing from the scope of the invention.

It should be noted that the present invention can be implemented by freely combining the above embodiments or by making a modification or omission to the embodiments as appropriate without departing from the scope of the present invention.

The invention claimed is:

1. A semiconductor device comprising:
an insulated-gate type bipolar transistor formed in a silicon carbide semiconductor region of a second conductivity type, and a diode connected in inverse-parallel with said insulated-gate type bipolar transistor;
said insulated-gate type bipolar transistor including:
an emitter electrode disposed on one main surface of said silicon carbide semiconductor region;
a plurality of base regions of a first conductivity type selectively disposed in an upper layer part on a side of said one main surface of said silicon carbide semiconductor region;
an emitter region of the second conductivity type selectively disposed in an upper layer part of each of said base regions and electrically connected to said emitter electrode;
a collector region of the first conductivity type disposed in an upper layer part on a side of the other main surface of said silicon carbide semiconductor region;
a collector electrode disposed on said other main surface of said silicon carbide semiconductor region and electrically connected to said collector region;
a gate insulating film disposed in continuous contact with said silicon carbide semiconductor region, said emitter region, and said base regions; and
a gate electrode arranged to face said silicon carbide semiconductor region, said emitter region, and said base regions via said gate insulating film,
said diode including:
a base contact region of the first conductivity type provided adjacent to said emitter region and electrically connected to said emitter electrode; and
a cathode region of the second conductivity type disposed in the upper layer part on the side of said other main surface of said silicon carbide semiconductor region, provided adjacent to said collector region, and electrically connected to said collector electrode, and
said insulated-gate type bipolar transistor further including:
a reduced carrier-trap region disposed in a principal current-carrying region of said silicon carbide semiconductor region located above said collector region, and having a smaller number of carrier traps than said silicon carbide semiconductor region located above said cathode region.

2. The semiconductor device according to claim 1, wherein
said reduced carrier-trap region is formed by implanting ions of at least one of carbon, silicon, hydrogen, and helium.

3. The semiconductor device according to claim 1, wherein
said reduced carrier-trap region is provided in said silicon carbide semiconductor region to extend from between adjacent two of said base regions to above said collector region.

4. The semiconductor device according to claim 2, wherein
said reduced carrier-trap region is provided in said silicon carbide semiconductor region to extend from between adjacent two of said base regions to above said collector region.

5. The semiconductor device according to claim 1, wherein
said gate insulating film is provided to cover an inner surface of a trench that is provided to extend from said one main surface of said silicon carbide semiconductor region located between adjacent two of said base regions to an inside of said silicon carbide semiconductor region,
said gate electrode is provided to fill said trench that has an inner surface covered with said gate insulating film, and
said reduced carrier-trap region is provided in said silicon carbide semiconductor region to extend from below said trench to above said collector region.

6. The semiconductor device according to claim 3, wherein
said gate insulating film is provided to cover an inner surface of a trench that is provided to extend from said one main surface of said silicon carbide semiconductor region located between adjacent two of said base regions to an inside of said silicon carbide semiconductor region, said gate electrode is provided to fill said trench that has an inner surface covered with said gate insulating film, and said reduced carrier-trap region is provided in said silicon carbide semiconductor region to extend from below said trench to above said collector region.

7. The semiconductor device according to claim 1, further comprising:

an impurity region provided across the whole of said one main surface of said silicon carbide semiconductor region in the upper layer part on the side of said one main surface and contains a higher concentration of impurities of the second conductivity type than said carbide semiconductor region, wherein said impurity region has a depth that includes said base regions and said emitter region, and said reduced carrier-trap region is provided in the silicon carbide semiconductor region to extend from below said impurity region located between adjacent two of said base regions to above said collector region.

8. The semiconductor device according to claim 2, further comprising:

an impurity region provided across the whole of said one main surface of said silicon carbide semiconductor region in the upper layer part on the side of said one main surface and contains a higher concentration of impurities of the second conductivity type than said carbide semiconductor region, wherein said impurity region has a depth that includes said base regions and said emitter region, and said reduced carrier-trap region is provided in the silicon carbide semiconductor region to extend from below said impurity region located between adjacent two of said base regions to above said collector region.

9. The semiconductor device according to claim 1, further comprising:

a carrier trap region provided in said silicon carbide semiconductor region located between said cathode region and said base regions above said cathode region, said carrier trap region having a larger number of carrier traps than said silicon carbide semiconductor region in which said carrier trap region is not provided.

10. The semiconductor device according to claim 2, further comprising:

a carrier trap region provided in said silicon carbide semiconductor region located between said cathode region and said base regions above said cathode region, said carrier trap region having a larger number of carrier traps than said silicon carbide semiconductor region in which said carrier trap region is not provided.

11. The semiconductor device according to claim 1, wherein said reduced carrier-trap region has a density of said carrier traps in a range of $1\times10^9$ cm$^{-3}$ to $1\times10^{13}$ cm$^{-3}$, and said silicon carbide semiconductor region other than said reduced carrier-trap region has a density of said carrier traps in a range of $1\times10^{11}$ cm$^{-3}$ to $1\times10^{15}$ cm$^{-3}$.

12. The semiconductor device according to claim 2, wherein said reduced carrier-trap region has a density of said carrier traps in a range of $1\times10^9$ cm$^{-3}$ to $1\times10^{13}$ cm$^{-3}$, and said silicon carbide semiconductor region other than said reduced carrier-trap region has a density of said carrier traps in a range of $1\times10^{11}$ cm$^{-3}$ to $1\times10^{15}$ cm$^{-3}$.

13. The semiconductor device according to claim 1, wherein a carrier lifetime in said reduced carrier-trap region is in a range of one microsecond to one millisecond, and a carrier lifetime in said silicon carbide semiconductor region other than said reduced carrier-trap region is in a range of one nanosecond to one microsecond.

14. The semiconductor device according to claim 2, wherein a carrier lifetime in said reduced carrier-trap region is in a range of one microsecond to one millisecond, and a carrier lifetime in said silicon carbide semiconductor region other than said reduced carrier-trap region is in a range of one nanosecond to one microsecond.

15. The semiconductor device according to claim 2, wherein an implantation surface density of atoms of one of carbon, silicon, hydrogen, and helium in said reduced carrier-trap region is in a range of $1\times10^{13}$ cm$^{-2}$ to $1\times10^{16}$ cm$^{-2}$.

16. A method of manufacturing a semiconductor device that includes an insulated-gate type bipolar transistor and a diode connected in inverse-parallel with said insulated-gate type bipolar transistor, the method comprising:

selectively forming a plurality of base regions of a first conductivity type in an upper layer part on a side of one main surface of a silicon carbide semiconductor region of a second conductivity type;

selectively forming an emitter region of the second conductivity type in an upper layer part of each of said base regions;

forming a base contact region of the first conductivity type adjacent to said emitter region;

forming a collector region of the first conductivity type in an upper layer part on a side of the other main surface of said silicon carbide semiconductor region;

forming a cathode region of the second conductivity type adjacent to said collector region in the upper layer part on the side of said other main surface of said silicon carbide semiconductor region;

forming a reduced carrier-trap region in said silicon carbide semiconductor region located above said collector region;

a heating of activating dopant atoms and diffusing interstitial carbon atoms;

forming a gate insulating film in continuous contact with said emitter region and said base regions;

forming a gate electrode to face said silicon carbide semiconductor region, said emitter region, and said base regions via said gate insulating film;

forming an emitter electrode in ohmic contact with said emitter region and said base contact region; and forming a collector electrode on said collector region and said cathode region;

(a) forming a surplus carbon atom-containing region where there are surplus interstitial carbon atoms by implanting interstitial carbon-inducing ions in a principal current-carrying region of said insulated-gate type bipolar transistor in said silicon carbide semiconductor region; and (b) after said (a), forming a reduced carrier-trap region having a small number of carrier traps in said current-carrying region by thermally diffusing said interstitial carbon atoms.

17. The method of manufacturing the semiconductor device according to claim 16, wherein
said (a) includes selecting an implantation surface density of said interstitial carbon-inducing ions that exceeds a carrier trap density in said silicon carbide semiconductor region.

18. The method of manufacturing the semiconductor device according to claim 16, wherein
said (b) includes setting a temperature of said silicon carbide semiconductor region in a range of 1000° C. to 2000° C. and thermally diffusing said interstitial carbon atoms.

19. The method of manufacturing the semiconductor device according to claim 16, further comprising:
forming a carrier trap region in said silicon carbide semiconductor region located between said cathode region and said base regions above said cathode region, by selectively applying electron beams from a main surface of said silicon carbide semiconductor region,
said carrier trap region having a larger number of carrier traps than said silicon carbide semiconductor region in which said carrier trap region is not provided.

20. A method of manufacturing a semiconductor device that includes an insulated-gate type bipolar transistor and a diode connected in inverse-parallel with said insulated-gate type bipolar transistor, the method comprising:
selectively forming a plurality of base regions of a first conductivity type in an upper layer part on a side of one main surface of a silicon carbide semiconductor region of a second conductivity type;
selectively forming an emitter region of the second conductivity type in an upper layer part of each of said base regions;
forming a base contact region of the first conductivity type adjacent to said emitter region;
forming a collector region of the first conductivity type in an upper layer part on a side of the other main surface of said silicon carbide semiconductor region;
forming a cathode region of the second conductivity type adjacent to said collector region in the upper layer part on the side of said other main surface of said silicon carbide semiconductor region;
forming a reduced carrier-trap region in said silicon carbide semiconductor region located above said collector region;
a heating of activating dopant atoms and diffusing interstitial carbon atoms;
forming a gate insulating film in continuous contact with said emitter region and said base regions;
forming a gate electrode to face said silicon carbide semiconductor region, said emitter region, and said base regions via said gate insulating film;
forming an emitter electrode in ohmic contact with said emitter region and said base contact region; and
forming a collector electrode on said collector region and said cathode region,
forming a reduced carrier-trap region in a principal current-carrying region of said insulated-gate type bipolar transistor in said silicon carbide semiconductor region located above said collector region, by selectively forming a thermal oxide film on a main surface of said silicon carbide semiconductor region that corresponds to said principal current-carrying region and causing surplus interstitial carbon atoms generated in a process of thermal diffusion to be diffused in said silicon carbide semiconductor region, said reduced carrier-trap region having a smaller number of carrier traps than said silicon carbide semiconductor region located above said cathode region.

21. The method of manufacturing the semiconductor device according to claim 20, further comprising:
forming a carrier trap region in said silicon carbide semiconductor region located between said cathode region and said base regions above said cathode region, by selectively applying electron beams from a main surface of said silicon carbide semiconductor region,
said carrier trap region having a larger number of carrier traps than said silicon carbide semiconductor region in which said carrier trap region is not provided.

* * * * *